US006175507B1

(12) United States Patent
Koradia et al.

(10) Patent No.: US 6,175,507 B1
(45) Date of Patent: Jan. 16, 2001

(54) APPARATUS AND METHOD FOR MOUNTING A BACKPLANE CIRCUIT BOARD TO AN ELECTRONIC CHASSIS

(75) Inventors: Amir Koradia, Palatine; Philip A. Ravlin, Bartlett; Douglas J. Pogatetz, Arlington Heights; Gerald A. Greco, Elk Grove Village, all of IL (US)

(73) Assignee: 3Com Corporation, Rolling Meadows, IL (US)

( * ) Notice: Under 35 U.S.C. 154(b), the term of this patent shall be extended for 0 days.

(21) Appl. No.: 09/258,692

(22) Filed: Feb. 26, 1999

(51) Int. Cl.$^7$ ...................................................... H05K 7/14
(52) U.S. Cl. .......................... 361/796; 361/756; 361/788; 361/802; 361/829; 312/223.1; 211/41.17; 220/4.02
(58) Field of Search ..................................... 361/724–725, 361/752, 753, 756, 788, 796, 797, 801, 802, 829; 312/223.1–223.3; 211/41.17; 220/4.02

(56) References Cited

U.S. PATENT DOCUMENTS

| 3,447,036 | * | 5/1969 | Dore et al. . | |
| 4,012,672 | * | 3/1977 | Douglass et al. | ..................... 361/829 |
| 4,602,829 | * | 7/1986 | De Andrea | ......................... 312/223.1 |
| 4,853,830 | * | 8/1989 | Corfits et al. | .......................... 361/725 |
| 5,173,845 | * | 12/1992 | Shaw | .................................... 361/798 |
| 5,745,349 | * | 4/1998 | Lemke | .................................. 361/818 |

* cited by examiner

Primary Examiner—Jayprakash N. Gandhi
(74) Attorney, Agent, or Firm—Baniak Pine & Gannon

(57) ABSTRACT

An apparatus for mounting a backplane circuit board to an electronic chassis is provided. An electronic chassis includes a first card guide assembly and a second card guide assembly. The first card guide assembly includes first and second guide pins. The first guide pin of the first card guide assembly is positioned adjacent a first end of the first card guide assembly and the second guide pin of the first card guide assembly is positioned adjacent a second end of the first card guide assembly. The second card guide assembly includes first and second guide pins. The first guide pin of the second card guide assembly is positioned adjacent a first end of the second card guide assembly and the second guide pin of the second card guide assembly is positioned adjacent a second end of the second card guide assembly. A backplane circuit board includes first and second openings to receive the first and second guide pins of the first card guide assembly and third and fourth openings to receive the first and second guide pins of the second card guide assembly. The third and fourth openings have a diameter less than a diameter of the first and second openings to allow a user to first position a bottom portion of the backplane circuit board against the second card guide assembly wherein the third and fourth openings receive the first and second guide pins of the second card guide assembly and second, to position a top portion of the backplane circuit board against the first card guide assembly wherein the first and second openings receive the first and second guide pins of the first card guide assembly to allow proper alignment of the backplane circuit board to the first and second card guide assemblies.

11 Claims, 1 Drawing Sheet

APPARATUS AND METHOD FOR MOUNTING A BACKPLANE CIRCUIT BOARD TO AN ELECTRONIC CHASSIS

FIELD OF THE INVENTION

This invention relates generally to the field of electronic chassis that house electronic components for high speed telecommunication and networking applications and, in particular, to an apparatus and method for mounting a backplane circuit board to an electronic chassis.

BACKGROUND OF THE INVENTION

An electronic chassis which houses electronic components for high speed telecommunication and networking applications typically includes two card guide assemblies mounted between side walls of the chassis, one located adjacent the top of the chassis and the other located adjacent the bottom of the chassis. A backplane circuit board having various surface mounted connectors is typically fastened to the two card guide assemblies and forms the back wall of the chassis. A plurality of vertically oriented circuit board assemblies, each of which are typically comprised of a circuit board attached to a U-shaped channel member, are typically inserted into the chassis along the card guide assemblies. When fully inserted into the chassis, the circuit boards are connected to the backplane circuit board.

In order to make the connections between the vertically oriented circuit boards within the chassis and the backplane circuit board, it is critical that the backplane circuit board be properly aligned with the chassis. Attempts have made to provide proper alignment by providing additional openings in the backplane circuit board and manually aligning the backplane circuit board prior to fastening it to the chassis. However, providing additional openings and manually aligning the backplane circuit board is labor intensive, time consuming, and results in increased manufacturing costs. Moreover, existing designs do not compensate for any deviations from specified design tolerances of the components of the chassis that may result during the fabrication process. As a result, deviations from design tolerances may make it difficult, if not impossible, to obtain proper alignment of the backplane circuit board.

Accordingly, it would be desirable to have an apparatus for mounting a backplane circuit board to an electronic chassis that overcomes the disadvantages described above.

SUMMARY OF THE INVENTION

One aspect of the invention provides an apparatus for mounting a backplane circuit board to an electronic chassis. An electronic chassis includes a first card guide assembly and a second card guide assembly. The first card guide assembly includes first and second guide pins. The first guide pin of the first card guide assembly is positioned adjacent a first end of the first card guide assembly and the second guide pin of the first card guide assembly is positioned adjacent a second end of the first card guide assembly. The second card guide assembly includes first and second guide pins. The first guide pin of the second card guide assembly is positioned adjacent a first end of the second card guide assembly and the second guide pin of the second card guide assembly is positioned adjacent a second end of the second card guide assembly. A backplane circuit board includes first and second openings to receive the first and second guide pins of the first card guide assembly and third and fourth openings to receive the first and second guide pins of the second card guide assembly. The third and fourth openings have a diameter less than a diameter of the first and second openings to allow a user to first position a bottom portion of the backplane circuit board against the second card guide assembly wherein the third and fourth openings receive the first and second guide pins of the second card guide assembly and second, to position a top portion of the backplane circuit board against the first card guide assembly wherein the first and second openings receive the first and second guide pins of the first card guide assembly to allow proper alignment of the backplane circuit board to the first and second card guide assemblies. The first and second guide pins of the first card guide assembly and the first and second guide pins of the second card guide assembly may preferably each include a tapered end portion. The backplane circuit board may preferably be comprised of at least two circuit boards. Each of the first and second openings may preferably be 0.215 inches in diameter. Each of the third and fourth openings may preferably be 0.200 inches in diameter. The first and second guide pins of the first card guide assembly and the first and second guide pins of the second card guide assembly may each be 0.187 inches in diameter. The first and second guide pins of the first card guide assembly and the first and second guide pins of the second card guide assembly may each be 0.375 inches in length. The first and second guide pins of the first card guide assembly and the first and second guide pins of the second card guide assembly may each be comprised of metallic material.

Another aspect of the invention provides a method of mounting a backplane circuit board to an electronic chassis. An electronic chassis including a first card guide assembly and a second card guide assembly is provided. The first card guide assembly includes first and second guide pins. The first guide pin of the first card guide assembly is positioned adjacent a first end of the first card guide assembly and the second guide pin of the first card guide assembly is positioned adjacent a second end of the first card guide assembly. The second card guide assembly includes first and second guide pins. The first guide pin of the second card guide assembly is positioned adjacent a first end of the second card guide assembly and the second guide pin of the second card guide assembly is positioned adjacent a second end of the second card guide assembly. A backplane circuit board includes first and second openings to receive the first and second guide pins of the first card guide assembly and third and fourth openings to receive the first and second guide pins of the second card guide assembly. The third and fourth openings have a diameter less than a diameter of the first and second openings. A bottom portion of the backplane circuit board is first positioned against the second card guide assembly, and the first and second guide pins of the second card guide assembly are received in the third and fourth bottom openings. A top portion of the backplane circuit board is then positioned against the first card guide assembly, and the first and second guide pins of the first card guide assembly are received in the first and second openings. The backplane circuit board may preferably be attached to the first and second card guide assemblies.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE PRESENTLY PREFERRED EMBODIMENTS

Figure 1:
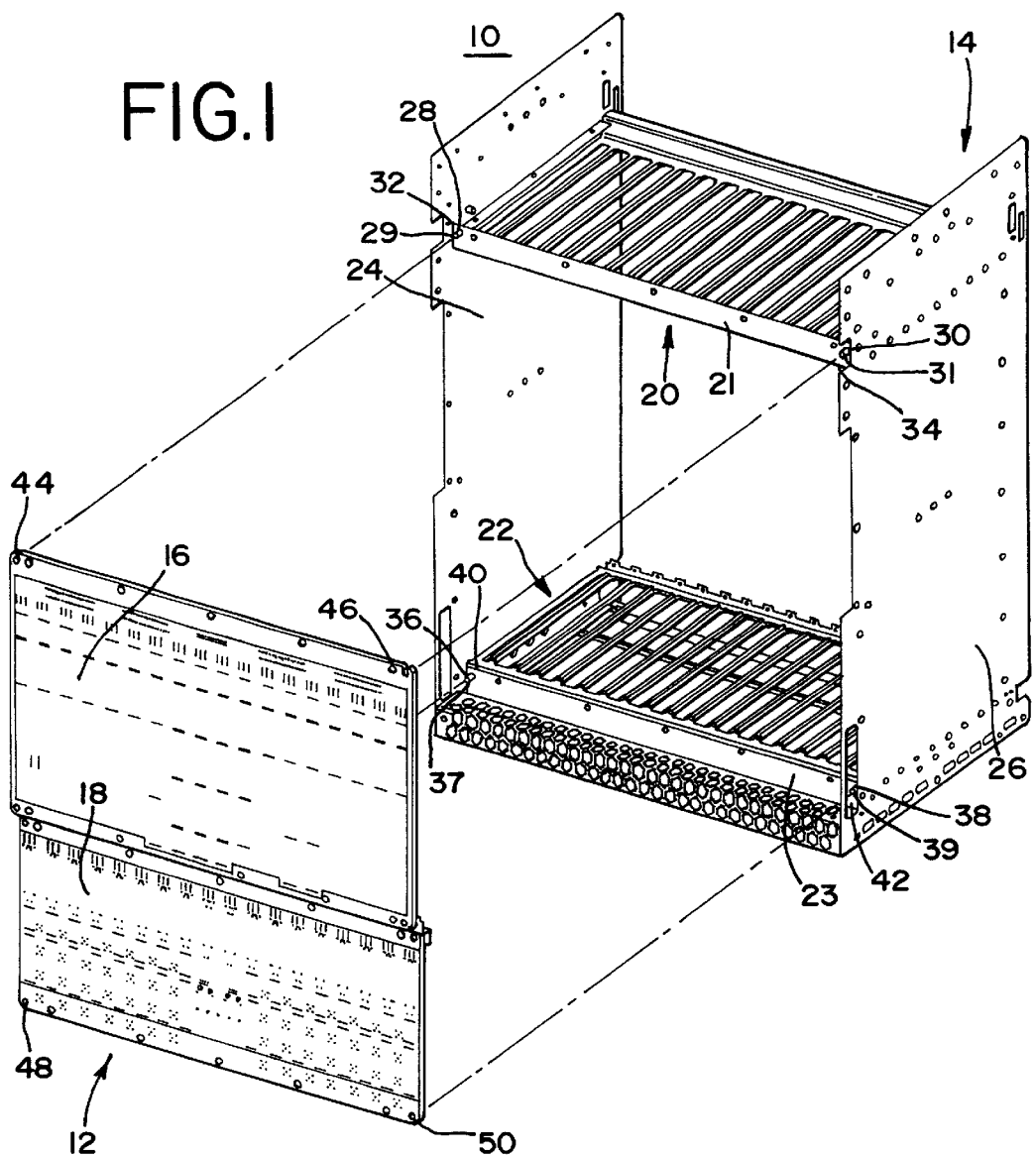
FIG. 1 is an exploded perspective view of a preferred embodiment of an apparatus for mounting a backplane circuit board to an electronic chassis that is made in accordance with the invention.

As shown in FIG. 1, a preferred embodiment of an apparatus 10 for mounting a backplane circuit board to an electronic chassis includes a backplane circuit board 12 and an electronic chassis 14. The backplane circuit board 12 may preferably be comprised of any conventional printed circuit board adapted to receive a plurality of vertically oriented circuit board assemblies (not shown) that are positioned in the electronic chassis 14. In the embodiment shown, the backplane circuit board 12 is adapted to be positioned along a back portion of the electronic chassis, and once installed, forms a back wall of the electronic chassis 14. As shown in FIG. 1, the backplane circuit board 12 may preferably be comprised of a first circuit board 16 and a second circuit board 18, although any number of circuit boards may be used for the backplane circuit board 12, and various configurations are contemplated.

The electronic chassis 14 includes a first card guide assembly 20 and a second card guide 22 assembly. The electronic chassis 14 may preferably be any suitable enclosure for housing various electronic components, and may preferably be comprised of steel, aluminum or any other suitable metallic material. In the embodiment shown, the first card guide assembly 20 extends between side walls 24, 26 of the electronic chassis 14 adjacent the top end of the side walls 24, 26. Similarly, the second card guide assembly 22 extends between the side walls 24, 26 of the electronic chassis 14 adjacent the bottom end of the side walls 24, 26. The first and second card guides assemblies 20, 22 may be comprised of any suitable rigid material such as, for example, steel, aluminum or any other suitable metallic material. The first and second card guide assemblies 20, 22 provide a guide for the plurality of vertically oriented circuit board assemblies (not shown) that are inserted into the electronic chassis 14. Also, as shown in FIG. 1, the first and second card guide assemblies 20, 22 each include mounting surfaces 21, 23 for the backplane circuit board 12.

The first card guide assembly 20 includes a first guide pin 28 and a second guide pin 30. The first and second guide pins 28, 30 ensure that backplane circuit board 12 is properly aligned with the first card guide assembly 20. The first guide pin 28 of the first card guide assembly 20 extends outward from the first card guide assembly 20 and is positioned adjacent a first end 32 of the first card guide assembly 20. The second guide pin 30 of the first card guide assembly 20 extends outward from the first card guide assembly 20 and is positioned adjacent a second end 34 of the first card guide assembly 20. The first and second guide pins 28, 30 of the first card guide assembly 20 may preferably have tapered end portions 29, 31, respectively. In addition, each of the first and second guide pins 28, 30 may preferably be 0.187 inches in diameter and 0.375 inches in length. The first and second guide pins 28, 30 may each be comprised of steel, aluminum, or any other suitable metallic material.

The second card guide assembly 22 includes a first guide pin 36 and a second guide pin 38. The first and second guide pins 36, 38 ensure that backplane circuit board 12 is properly aligned with the second card guide assembly 22. The first guide pin 36 of the second card guide assembly 22 extends outward from the second card guide assembly 22 and is positioned adjacent a first end 40 of the second card guide assembly 22. The second guide pin 38 of the second card guide 22 assembly extends outward from the second card guide assembly 22 and is positioned adjacent a second end 42 of the second card guide assembly 22. The first and second guide pins 36, 38 of the second card guide assembly 22 may preferably have tapered end portions 37, 39, respectively. In addition, each of the first and second guide pins 36, 38 may preferably be 0.187 inches in diameter and 0.375 inches in length. The first and second guide pins 36, 38 may each be comprised of steel, aluminum, or any other suitable metallic material.

The backplane circuit board 12 includes a first opening 44 and a second opening 46 to receive the first and second guide pins 28, 30 of the first card guide assembly 20. The backplane circuit board 12 also includes a third opening 48 and a fourth opening 50 to receive the first and second guide pins 36, 38 of the second card guide assembly 22. The third and fourth openings 48, 50 have a diameter that is less than a diameter of the first and second openings 44, 46. For example, each of the first and second openings 44, 46 may preferably be 0.215 inches in diameter, and each of the third and fourth openings 48, 50 may preferably be 0.200 inches in diameter. The difference between the diameter of the third and fourth openings 48, 50 and the diameter of the first and second openings 44, 46 compensate for any deviations from specified design tolerances that may occur as a result of the fabrication process.

In operation, a user first positions a bottom portion of the backplane circuit board 12 against the second card guide assembly 22 wherein the third and fourth openings 48, 50 of the backplane circuit board 12 receive the first and second guide pins 36, 38 of the second card guide assembly 22. The third and fourth openings 48, 50 of the backplane circuit board 12 may preferably be dimensioned to accept the first and second guide pins 36, 38 of the second card guide assembly 22. The user then positions a top portion of the backplane circuit board 12 against the first card guide assembly 20 wherein the first and second openings 44, 46 of the backplane circuit board receive the first and second guide pins 28, 30 of the first card guide assembly 20. The backplane circuit board 12 may preferably be attached to the first and second card guide assemblies 20, 22 with conventional fasteners such as, for example, rivets, screws, or bolts. The arrangement of the guide pins 28, 30, 36, 38 in combination with the specifically dimensioned openings 44, 46, 48, 50 ensures that the backplane circuit board 12 can be mounted to the electronic chassis 14 quickly and easily, and that the backplane circuit board 12 will be properly aligned with respect to the first and second card guide assemblies 20, 22 of the electronic chassis 14. This arrangement also compensates for any deviations from acceptable design tolerances that may occur during fabrication of the components of the electronic chassis 14.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An apparatus for mounting a backplane circuit board to an electronic chassis comprising:

an electronic chassis including a first card guide assembly and a second card guide assembly, the first card guide assembly including first and second guide pins, the first guide pin of the first card guide assembly positioned adjacent a first end of the first card guide assembly and the second guide pin of the first card guide assembly positioned adjacent a second end of the first card guide assembly, the second card guide assembly including first and second guide pins, the first guide pin of the second card guide assembly positioned adjacent a first end of the second card guide assembly and the second guide pin of the second card guide assembly positioned adjacent a second end of the second card guide assembly, a backplane circuit board including first and second openings to receive the first and second guide pins of the first card guide assembly and third and fourth openings to receive the first and second guide pins of the second card guide assembly, the third and fourth openings having a diameter less than a diameter of the first and second openings to allow a user to first position a bottom portion of the backplane circuit board against the second card guide assembly wherein the third and fourth openings receive the first and second guide pins of the second card guide assembly and second, to position a top portion of the backplane circuit board against the first card guide assembly wherein the first and second openings receive the first and second guide pins of the first card guide assembly to allow proper alignment of the backplane circuit board to the first and second card guide assemblies.

2. The apparatus of claim 1 wherein the first and second guide pins of the first card guide assembly and the first and second guide pins of the second card guide assembly each include a tapered end portion.

3. The apparatus of claim 1 wherein the backplane circuit board is comprised of at least two circuit boards.

4. The apparatus of claim 1 wherein the first and second openings are each 0.215 inches in diameter.

5. The apparatus of claim 1 wherein the third and fourth openings are each 0.200 inches in diameter.

6. The apparatus of claim 1 wherein the first and second guide pins of the first card guide assembly and the first and second guide pins of the second card guide assembly are each 0.187 inches in diameter.

7. The apparatus of claim 1 wherein the first and second guide pins of the first card guide assembly and the first and second card pins of the second card guide assembly are each 0.375 inches in length.

8. The apparatus of claim 1 wherein the first and second guide pins of the first card guide assembly and the first and second guide pins of the second card guide assembly are each comprised of metallic material.

9. A method of mounting a backplane circuit board to an electronic chassis comprising:
  (a) providing an electronic chassis including a first card guide assembly and a second card guide assembly, the first card guide assembly including first and second guide pins, the first guide pin of the first card guide assembly positioned adjacent a first end of the first card guide assembly and the second guide pin of the first card guide assembly positioned adjacent a second end of the first card guide assembly, the second card guide assembly including first and second guide pins, the first guide pin of the second card guide assembly positioned adjacent a first end of the second card guide assembly and the second guide pin of the second card guide assembly positioned adjacent a second end of the second card guide assembly, a backplane circuit board including first and second openings to receive the first and second guide pins of the first card guide assembly and third and fourth openings to receive the first and second guide pins of the second card guide assembly, the third and fourth openings having a diameter less than a diameter of the first and second openings;
  (b) positioning a bottom portion of the backplane circuit board against the second card guide assembly;
  (c) receiving the first and second guide pins of the second card guide assembly in the third and fourth bottom openings;
  (d) positioning a top portion of the backplane circuit board against the first card guide assembly; and
  (e) receiving the first and second guide pins of the first card guide assembly in the first and second openings.

10. The method of claim 9 further comprising:
performing steps (b) and (c) prior to steps (d) and (e).

11. The method of claim 9 further comprising:
attaching the backplane circuit board to the first and second card guide assemblies.

* * * * *